(12) United States Patent
Nagai et al.

(10) Patent No.: US 6,342,697 B1
(45) Date of Patent: Jan. 29, 2002

(54) METHOD AND APPARATUS FOR DETECTING ORIGIN OF MEASUREMENT

(75) Inventors: Ryo Nagai; Shingo Kuroki, both of Kawasaki (JP)

(73) Assignee: Mitutoyo Corporation, Kawasaki (JP)

( * ) Notice: Subject to any disclaimer, the term of this patent is extended or adjusted under 35 U.S.C. 154(b) by 0 days.

(21) Appl. No.: 09/398,751

(22) Filed: Sep. 17, 1999

(30) Foreign Application Priority Data

Sep. 21, 1998 (JP) ............................................. 10-266963

(51) Int. Cl.[7] ................................................. G01D 5/34
(52) U.S. Cl. ............................. 250/231.13; 250/237 G; 356/616
(58) Field of Search ....................... 250/231.13–231.18, 250/237 G; 33/706, 707; 356/616, 617, 619

(56) References Cited

U.S. PATENT DOCUMENTS

| | | | |
|---|---|---|---|
| 4,462,159 A | 7/1984 | Nelle | 33/679.1 |
| 4,477,189 A | 10/1984 | Ernst | 356/619 |
| 4,479,716 A | 10/1984 | Nelle | 356/619 |
| 4,491,928 A | 1/1985 | Reichl | 702/161 |
| 4,519,140 A | 5/1985 | Schmitt | 33/706 |
| 4,678,908 A * | 7/1987 | LaPlante | 250/231.14 |
| 4,688,019 A | 8/1987 | Schmitt | 341/1 |
| 4,701,615 A * | 10/1987 | Schmitt | 250/237 G |
| 4,999,623 A | 3/1991 | Affa | 341/13 |
| 6,031,224 A * | 2/2000 | Peterlechner | 250/231.13 |

* cited by examiner

*Primary Examiner*—Que T. Le
*Assistant Examiner*—Thanh X Luu
(74) *Attorney, Agent, or Firm*—Oliff & Berridge, PLC

(57) ABSTRACT

An interpolation circuit generates two-phase square wave signals PA and PB from two-phase sinusoidal wave outputs ØA and ØB supplied from a photoelectric encoder. A gate signal generator slices a primary origin signal ØZ supplied from the photoelectric encoder with a predetermined reference level VRef to generate a gate signal Z. A first counter begins to count position pulses generated from the two-phase square wave signals PA and PB when the gate signal Z becomes active. A count value of the first counter is divided by two when the gate signal Z becomes non-active and the divided value is preset into a second counter. The second counter counts the position pulses generated from the two-phase square wave signals PA and PB. A comparator feeds an output origin signal PZ when a count value of the second counter reaches a predetermined offset value N.

7 Claims, 6 Drawing Sheets

METHOD AND APPARATUS FOR DETECTING ORIGIN OF MEASUREMENT

BACKGROUND OF THE INVENTION

1. Field of the Invention

The present invention relates to a measuring origin detection method and apparatus for determining a reference position in a position-detecting means such as an optical linear encoder, and more particularly to an origin detection method and apparatus suitably applicable for a simple and compact encoder.

2. Description of the Related Art

A conventional contact and transmission type encoder can sustain a narrow gap in a detection section without variations using a gap holding device of a contact type. Therefore, an origin detection system that forms random patterned origin marks with a fine fundamental pitch or a high spatial frequency on scales can be employed in such the encoder. FIG. 8A is a waveform diagram showing a primary origin signal and an output origin signal obtained from such the random pattern. The primary origin signal contains a sharp peak when the random pattern is used, and a sharp output origin signal can be obtained by slicing the origin signal with a predetermined reference level. Thus, an original position can be detected with a relatively higher reproducibility accordingly.

A non-contact and reflection type encoder is on the other hand required to setting a large gap and allowable variation margin thereof in a detection section in order to maintain a non-contact state. And it is difficult to detect an origin using such a random pattern with a fine fundamental pitch as that of the contact transmission type. Therefore, such a rough slit pattern as shown in FIG. 8B may often be employed A primary origin signal shown in FIG. 8B has a slow gradient on the edge. Therefore, a method for obtaining an output origin signal by slicing the waveform of the primary origin signal that is obtained from the rough slit pattern with a reference level may vary a position of the edge of the output origin signal due to a temperature drift and the like. The slower the gradient of the primary origin signal, the larger such the variation The variation rate may increase up to 10–30 times that in case of the random pattern of the contact and transmission type being used. If using the output origin signal as it is, the position reproducibility may be lowered disadvantageously by one order relative to the random pattern system.

SUMMARY OF THE INVENTION

The present invention has been made in consideration of such the problems and accordingly has an object to provide an origin detection system capable of achieving a more excellent reproducibility than the conventional edge-detecting origin detection system while maintaining a structure of a simple and compact detection section.

The present invention is provided with an origin detection apparatus for detecting an original position serving as a reference for meaning a relative position of an index scale to a main scale. The apparatus comprises a position detecting device for providing a position detection signal in accordance with a variation of the relative position of the index scale to the main scale. The position detecting device also provides a primary origin signal having a variable level in accordance with the degree of an overlap of origin detection patterns formed respectively on the main and index scales. The apparatus also comprises a gate signal generating circuit or generating a gate signal by slicing the primary origin signal with a predetermined reference level. The apparatus further comprise a position pulse counting circuit or beginning to count position pulses derived from the position detection signals when the gate signal generated from the gate signal generating circuit becomes active and dividing a count value by two when the gate signal becomes non-active. A count value obtained from the position pulse counting circuit after divided by two at the position pulse counting circuit gives a reference for origin detection.

The present invention is also provided with an origin detection method for detecting an original position serving as a reference for position measurement by position detection means. The method comprises the step of monitoring a position pulse generated from a position detection signal out of the position detection means and a gate signal obtained by binarizing a primary origin signal with a predetermined reference level and beginning to count the position pulses after the gate signal becomes active. The method also comprises the step of dividing a count value by two when the gate signal becomes non-active. The method further comprises the step of feeding an output origin signal when a count value after divided by two reaches a predetermined offset value.

According to the present invention, the position pulses are counted during the gate signal obtained by binarizing the primary origin signal with the predetermined reference level remains active. Then, the count value is divided by two when a length of the gate signal is completely counted. Thus, a count value that begins at the just medium point between the rise (or fall) and fall (or rise) of the gate signal can be obtained. If the primary origin signal varies slowly, positions of edges obtained by binarizing the signal may vary greatly in general due to the temperature drift and the like while the medium point between the edges, that is, a peak position of the primary origin signal hardly varies. The present invention notices this fact and employs the central position between the edges of the gate signal as a reference. Therefore, even though the gradient of the edge of the primary origin signal is slow, it can hardly effect. Thus, origin detection with an excellent reproducibility can be achieved.

The position pulse counting means counts a gate pulse width during the scale moves and then the count value is divided by two. If an origin output means is further provided for feeding an output origin signal when a count value from the position pulse counting means after divided by two reaches a predetermined offset value, origin detection can be performed in real time when the detection section moves relative to the scale.

Binarization of the primary origin signal produces the gate signal. In such the level comparison process, a comparator with hysteresis characteristic is preferably employed usually to prevent a misdetection due to noises. In case of the present invention, however, if the comparator has a hysteresis characteristic, positions of both edges of the gate signal may shift in either direction. To solve such the problem, the gate signal generating circuit may preferably include first and second comparators The first comparator detects a transition of the primary origin signal from a high level to a low level with the predetermined reference level and detects a transition of the primary origin signal from the low level to the high level with a higher level than the predetermined reference level. The second comparator detects the transition of the primary origin signal from the high level to the low level with a lower level than the predetermined reference level and detects the transition of the primary origin signal from the low level to the high level with the predetermined reference level The gate signal generating circuit further includes a selection circuit for selecting the output from the first comparator during the first half of the duration after the gate signal becomes active and before the gate signal becomes non-active. The selection circuit further selects the output from the second comparator during the second half of the duration These selected outputs are fed as the gate signal If the gate signal generating means is configured as above, the threshold level for detecting the transition from the high level to the low level used in the first comparator of two comparators with hysteresis characteristics is coincident with the threshold level for detecting the transition from the low level to the high level used in the second comparator. In addition, these transitions are respectively selected at the selection means to generate the gate signal Thus, it is possible to prevent the edge positions of the gate signal from varying while improving the anti-noise performance with the hysteresis characteristic simultaneously.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings in which.

DETAILED DESCRIPTION OF THE PREFERRED EMBODIMENTS

Preferred embodiment of the present invention will be described below with reference to the accompanying drawings.

Figure 1:
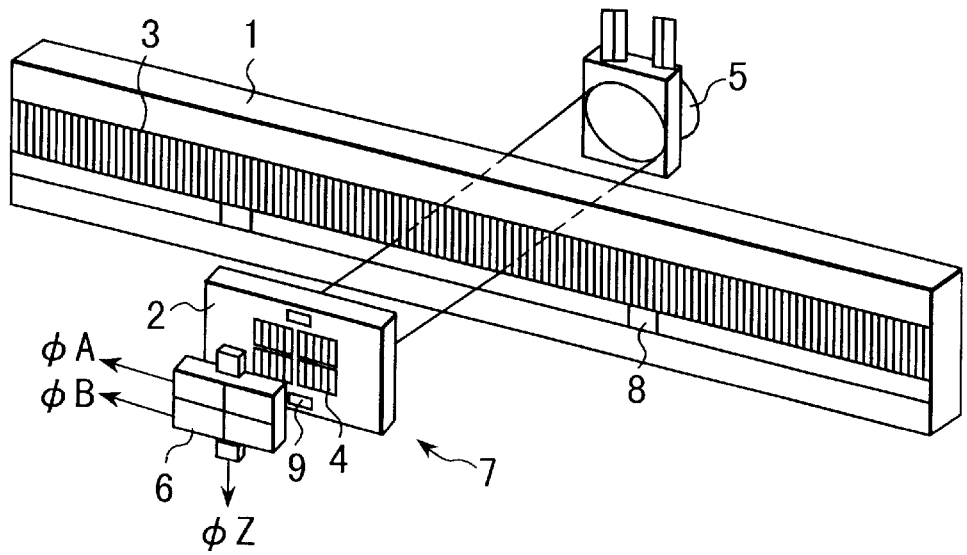
FIG. 1 is a disassembled perspective view of a linear encoder adaptive for an origin detection system according to an embodiment of the present invention.
Figure 8A:
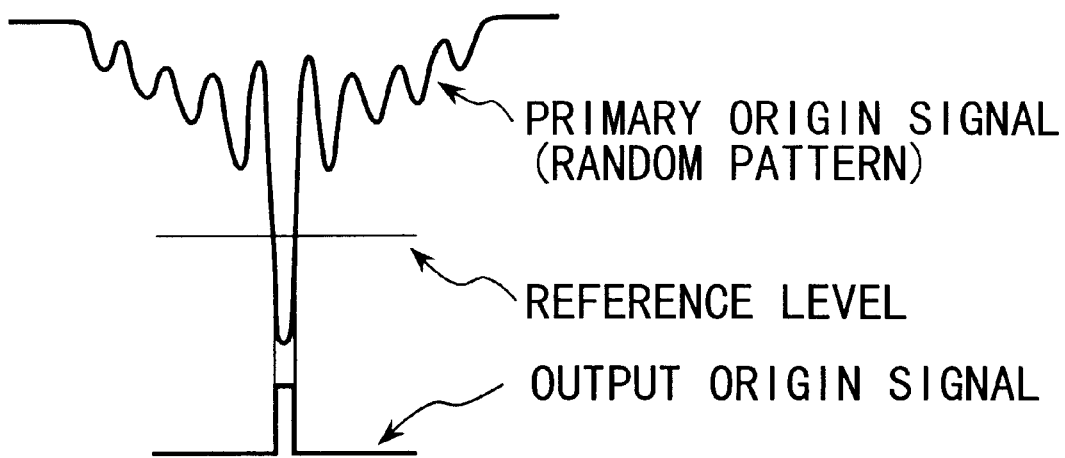
FIGS. 8A and 8B are dams illustrating conventional origin detection methods with a random pattern and a slit pattern.
Figure 8B:
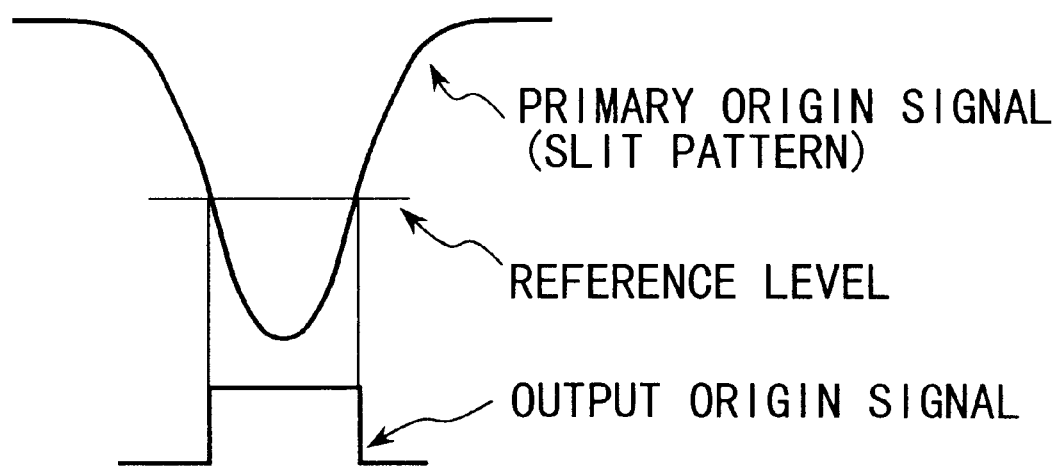

FIG. 1 is a perspective view showing a general arrangement of a linear encoder, which configures a position-detecting device for use in an origin detection system according to an embodiment of the present invention. The linear encoder outputs a primary origin signal ØZ and two-phase sinusoidal wave signals ØA and ØB that are position detection signals. The linear encoder is a photo-electric encoder of a transmission type that includes a main scale 1 and an index scale 2 disposed opposing to each other. Optical lattices 3 and 4 with a given pitch are formed on both scales 1 and 2. A light source 5 such as an LED and a photosensitive device 6 such as a photodiode oppose to each other interposing both scales 1 and 2 therebetween. The index scale 2, light source 5 and photosensitive device 6 configure a detection section 7 that moves relatively against the main scale 1. A light passing through the optical lattices 3 and 4 of the scales 1 and 2 repeats light and darkness at the same period as the lattice pitch during the detection section 7 moves. The photosensitive device 6 converts the variations into electric signals and outputs position detection signals with a phase difference of 90° therebetween, that is, the two-phase sinusoidal wave signals ØA and ØB. Patterns 8 and 9 for origin detection are formed on certain positions of the scales 1 and 2. The photosensitive device 6 outputs the primary origin signal ØZ in accordance with the degree of an overlap of the patterns 8 and 9 as shown in FIG. 8A or 8B.

Figure 2:
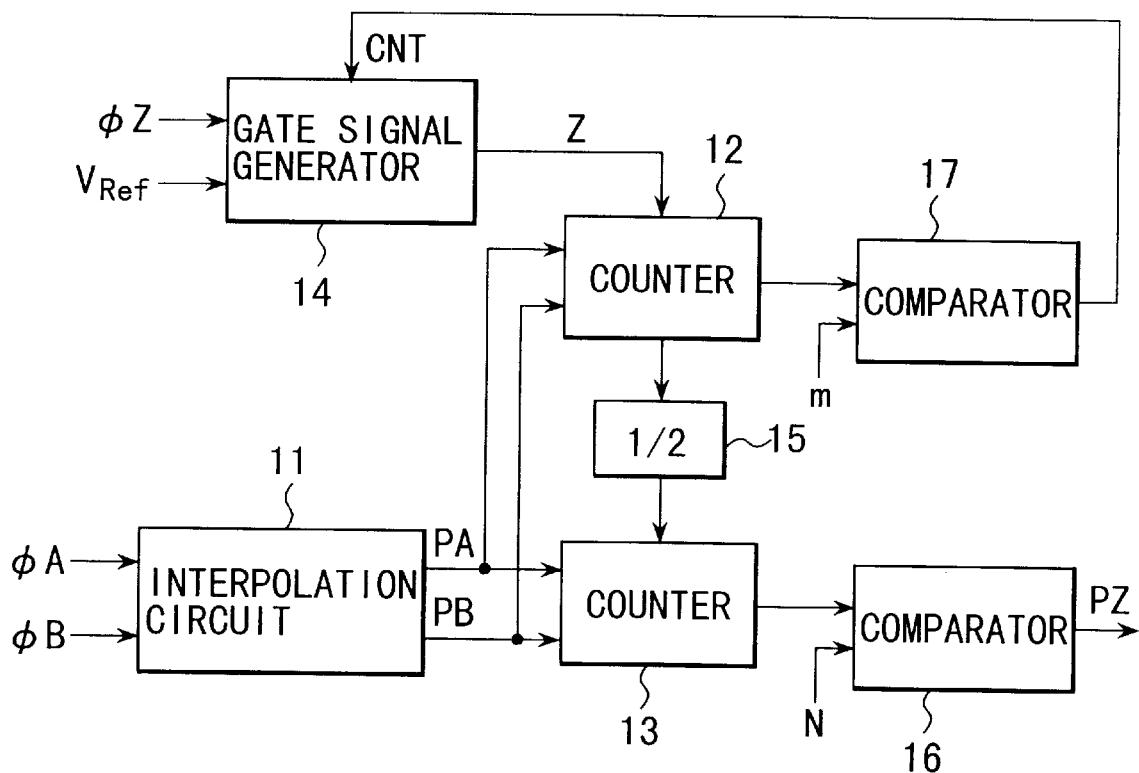
FIG. 2 is a block diagram of an origin detector according to the embodiment.

FIG. 2 is a diagram showing an origin detector for generating an output origin signal PZ from the two-phase sinusoidal wave signal ØA, ØB and primary origin signal ØZ.

The two-phase sinusoidal wave signals ØA and ØB arc fed into an interpoltion circuit 11 which divides the periods of the two-phase sinusoidal wave signals ØA and ØB by a certain number to generate two-phase square wave signals PA and PB. If the lattice pitch of the scales 1 and 2 is equal to 20 $\mu$m for example, the interpolation circuit 11 divides them by 100 to generate two-phase square wave signals PA and PB with a pitch of 0.2 $\mu$m and a resolution of 0.05 $\mu$m. These two-phase square wave signals PA and PB have a phase different of 90° therebetween, for example, and a preceding one of the rise edges may determine the moving direction of the index scale 2. Counters 12 and 13 that configure a position pulse counting circuit introduce the two-phase square wave signals PA and PB and detect the rise and fall edges of the signals PA and PB to count up or down position pulses PULSE with a pitch of 0.05 $\mu$m. for example.

On the other hand, a gate signal generator 14 slices the primary origin signal ØZ with a predetermined reference level VRef to generate a gate signal Z The gate signal Z is supplied to the counter 12 The counter 12 begins to count the position pulses PULSE when the gate signal Z becomes active. A count value of the counter is shifted by one bit at a ½ circuit 15 to divide the count value by two when the gate signal Z becomes inactive and the divided value is preset into the counter 13. Alternatively, this may be processed to simply preset the count value excluding the least significant bit from the counter 12 to the counter 13. The counter 13 counts the position pulses PULSE after the divided value is preset. A count value from the counter 13 is supplied to a comparator 16 that is an origin output circuit. The comparator 16 compares an input count value with a predetermined offset value N and provides an output origin signal PZ when both are coincident with each other. Another comparator 17 compares the count value out of the counter 12 with a later described predetemined value m and provides a control signal CNT when both meet with each other. The control signal CNT is fed to the gate signal generator 14 and is used for generating the gate signal Z as described later.

An operation of thus configured origin detector will be described next.

Figure 3:
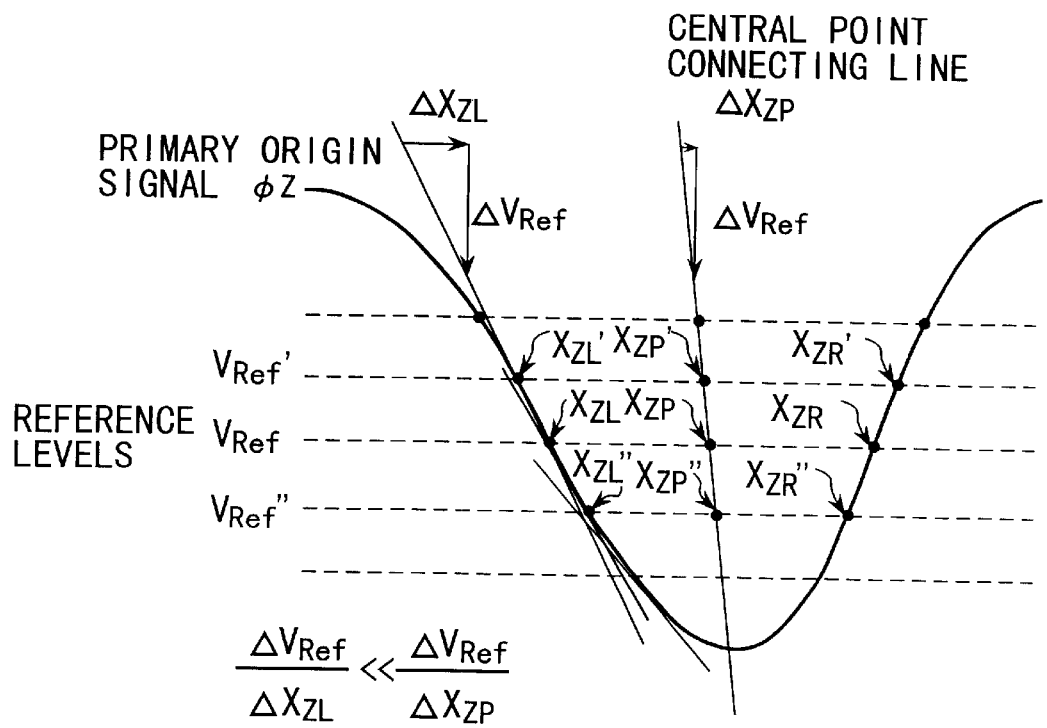
FIG. 3 is a diagram illustrating the central value between edges of a primary origin signal detected at the detector.

FIG. 3 is a diagram illustrating a relationship among the primary origin signal ØZ, the reference level VRef and an origin detection position. When slicing the prinary origin signal ØZ with reference levels VRet VRef', VRef", left and right edge positions XZL, XZL', XZL", XZR, XZR', XZR" vary greatly along the moving direction of the detection section 7. This indicates that the edge positions of the gate signal Z may vary greatly due to the light intensity of the light source 5 and the temperature characteristics of the light source 5 and photosensitive device 6 and the like. Connecting respective central points XZP, XZP', XZP" of the left and right edge positions XZL-XZR, XZL'-XZR', XZL"-XZR" may form a central point connecting line. The line meets with the normal as depicted in the drawing at the peak value of the primary origin signal ØZ if it is perfect symmetry with respect to an axis. Actually, the central point connecting line may slightly incline from the normal under affections from lack of uniformity of the light intensity distribution, for example. The gradient ΔXZP/ΔRef, however, is far less than the gradient ΔXZL/ΔVRef at each slicing point. Therefore, the central point connecting line can be considered to almost meet with the normal at the peak value of the primary origin signal ØZ Accordingly, the original position can be defined with an excellent reproducibility using the central points rather than the slicing positions of the primary origin signal ØZ Even though the central axis that passes through the peak of the primary origin signal ØZ can be deduced from the waveform, the central point of the slicing positions can not be deduced till the detection section 7 actually passes through the two points. Thus, the position of the central point can not be output directly in real time as the origin signal Then, the output origin signal PZ in the embodiment is output at a position offset by the given value N from the peak position of the primary origin signal ØZ.

Figure 4:
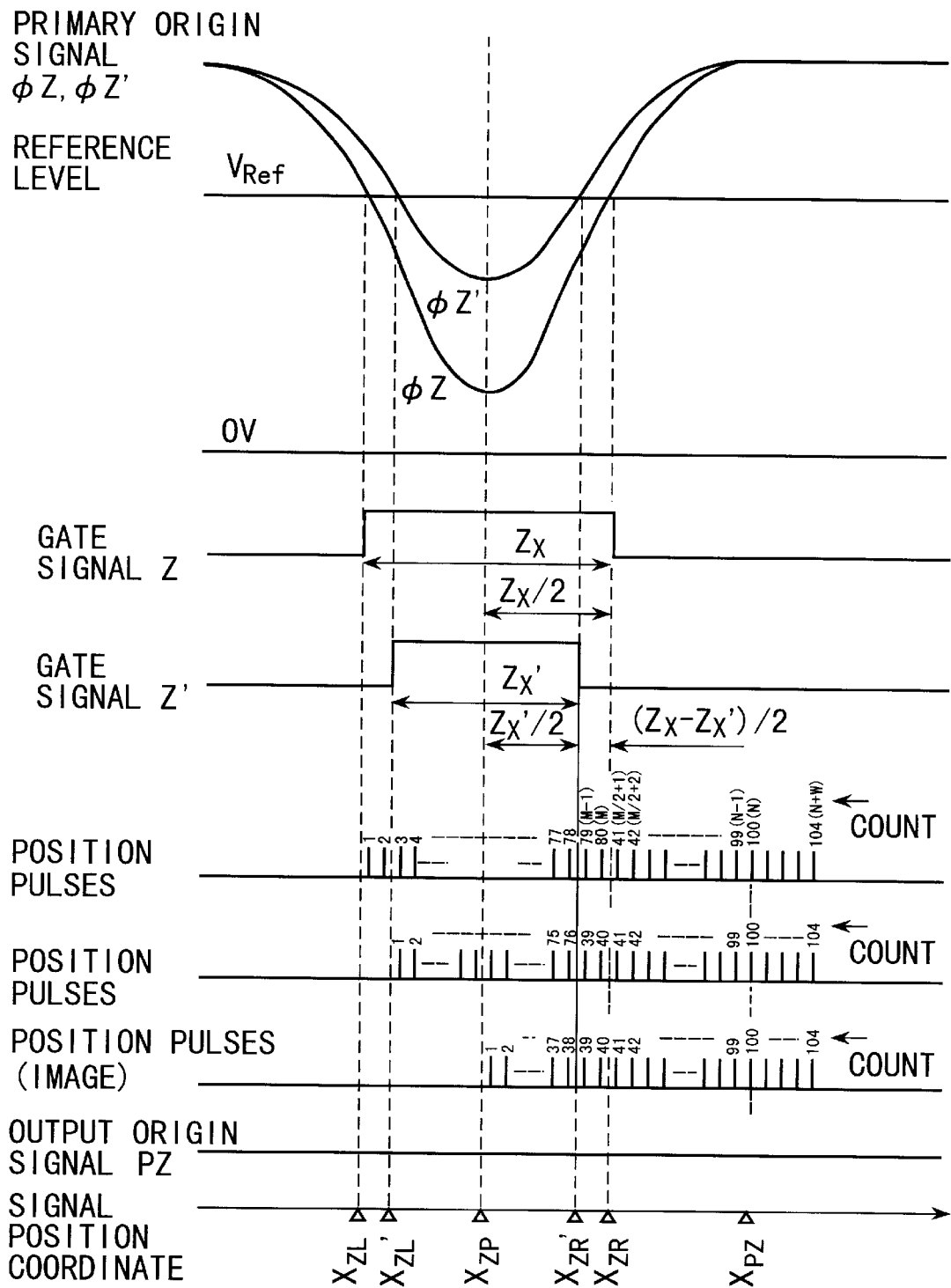
FIG. 4 is a timing chart illustrating an operation of the detector.

FIG. 4 is a timing chart illustrating an origin detection operation of the detector of FIG. 2.

The gate signal Z can be obtained by slicing, with the reference level VRef, the primary origin signal ØZ that is obtained by moving the detection section 7 of the linear scale in the given direction after moving it to the home position. The counter 12 begins to count the position pulses PULSE at the rise XZL of the gate signal Z. If a count value of the counter 12 that counted to the fall XZR of the gate signal Z is equal to 80, the count value becomes 80/2=40 at the fall of the gate signal Z and is preset into the counter 13, which in turn begins to count from 41. If the offset value N is equal to 100, the comparator 16 feeds the output origin signal PZ when the count value of the counter 13 reaches 100. The output origin signal PZ in this case has a pulse width equal to 4 pulses of the position pulses PULSE.

If the primary origin signal varies its level as ØZ→ØZ', the gate signal varies as Z→Z', varying its rise position as XZL→XZL' and its fall position as XZR→XZR' both inwardly. In this case, the beginning to count the position pulses PULSE and the timing to divide the count value by two are different from those in the above example, for example. Nonetheless, the primary origin signal ØZ' still has the same peak position as that of the primary origin signal ØZ, and can be considered to be symmetry with respect to the central axis Thus, at the time of dividing the count value of the counter 12 by two, the divided value becomes equivalent to that obtained by counting the same weighting pulses from the central position XZP. Accordingly, the timing to finish counting 100 at the counter 13 is quite similar to the aforementioned example.

When the circuit of this embodiment is employed in that manner, even the slit system that generates the primary origin signal ØZ having edges with relatively slower gradients can obtain the output origin signal PZ with excellent reproducibility so long as the axial symmetry of the primary origin signal ØZ can be ensured to some extent.

Figure 5:
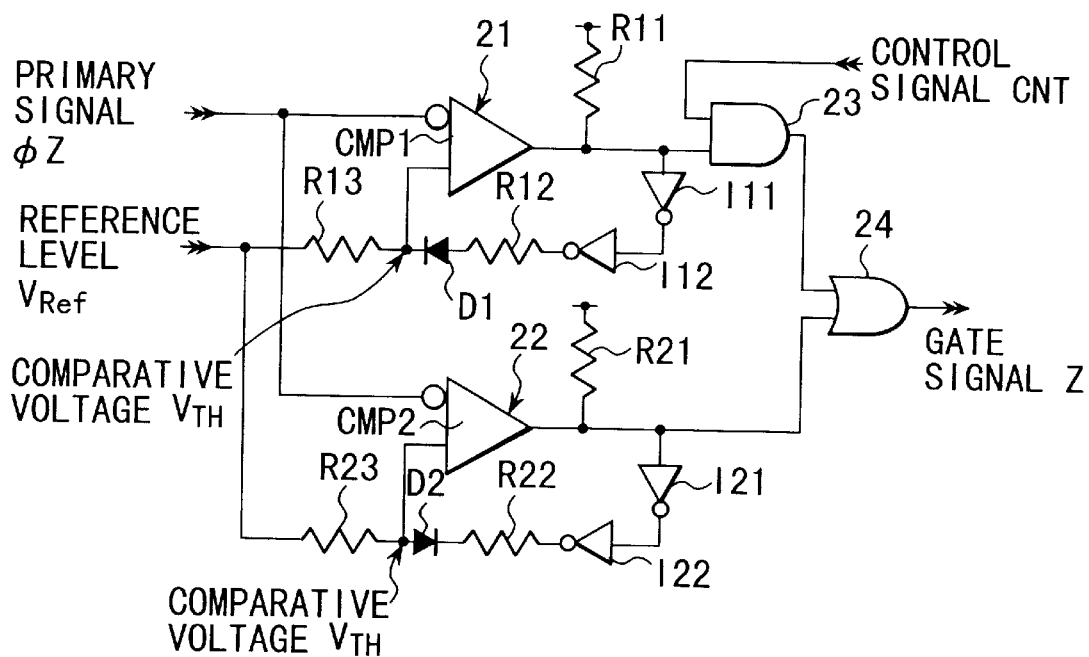
FIG. 5 is a detailed circuit diagram of a gate signal generator in the detector.

A comparator is generally employed to slice the primary origin signal ØZ with the reference level VRef. If the two signals to be compared have the same or almost same levels, the comparator may operate unstably. Than, the comparator is often configured to have a hysteresis characteristic in general. If the comparator has the hysteresis characteristic, however, different slice levels are required for slicing the primary origin signal ØZ in order to obtain the rise position XZL and fall position XZR of the gate signal l As a result, the central position XZP between XZL and XZR cannot meet with the peak position of the primary origin signal ØZ. Then, the gate signal generator 14 in this embodiment is configured as shown in FIG. 5.

Figure 6:
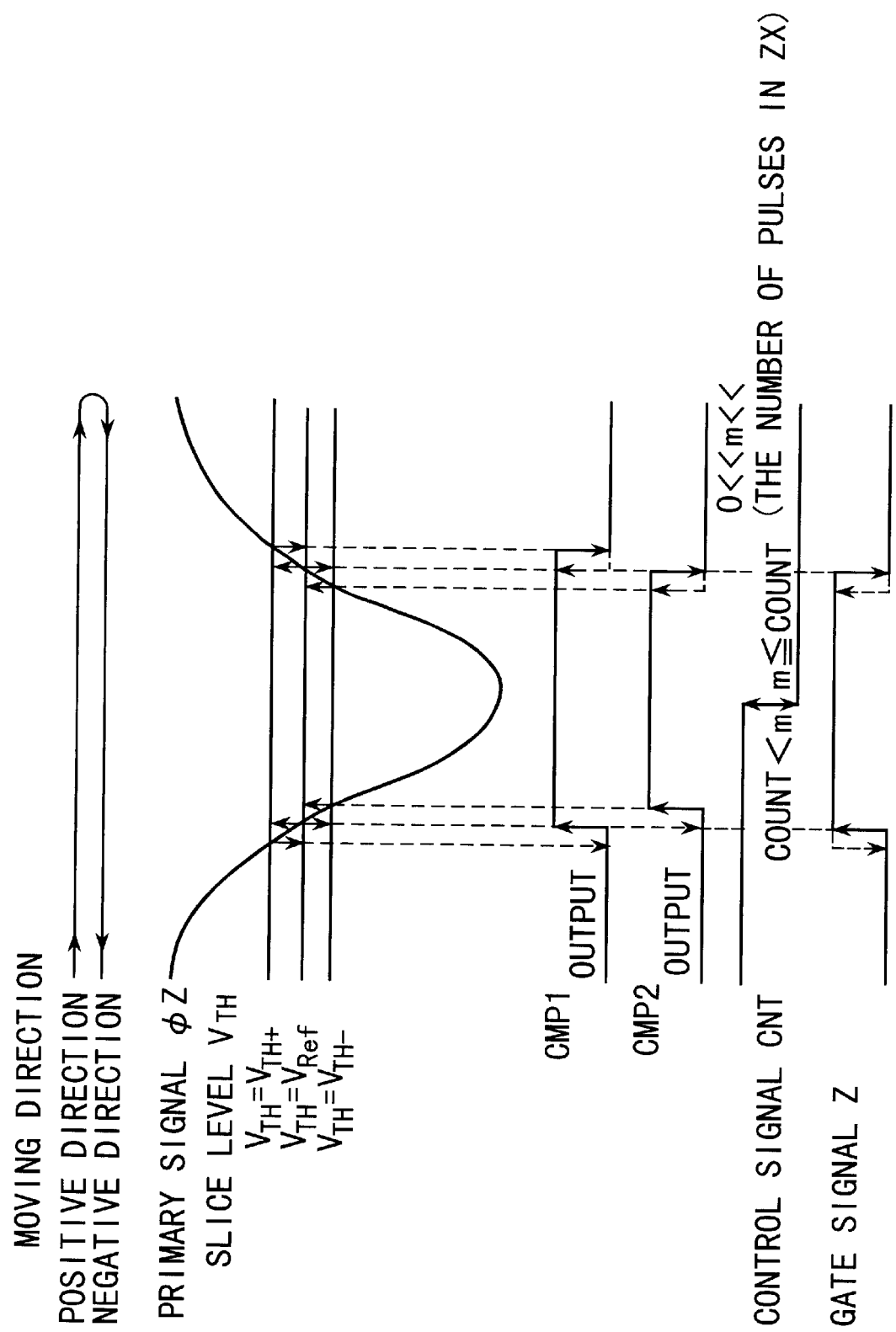
FIG. 6 is a waveform diagram illustrating an operation of the gate signal generator.

The gate signal generator 14 comprises a first comparator 21, a second comparator 22, and a selecting means, for switching the outputs of the comparators 21 and 22, which includes an AND gate 23 and an OR gate 24. The first comparator 21 employs resistors R11, R12, R13, inverters 111, 112 and a diode D1. It adapts a slice level equal to the reference level VRef and a higher slice level VTH+ than the reference level VRef for detecting the fall and rise transition of the primary origin signal ØZ as shown in FIG. 6. The second comparator 22 employs resistors R21, R22, R23, inverters 121, 122 and a diode D2. It adapts a lower slice level VTH− than the reference level VRef and a slice level equal to the reference level VRef for detecting the fall and rise transition of the primary origin signal ØZ as shown in FIG. 6.

When the control signal CNT varies from the high level to the low level during the gate signal Z is output, the OR gate 24 selects the output from the first comparator 21 at the time of the rise of the gate signal Z and the output from the second comparator 22 at the time of the fall of the gate signal Z. Therefore, the gate signal Z finally obtained from the OR gate 24 becomes the same as a signal obtained by slicing with a single reference level VRef whose central position between the rise and fall positions does not vary as shown in lig. 6.

The control signal CNT may be generated from the count value of the counter 12. The first and second comparators 21 and 22 are required to switch at a position where a negative or positive edge of the primary origin signal ØZ is fiar apart from the comparative level VTH and is free from an unstable state due to noises and vibrations. Therefore, it is necessary to previously set a numeral value m within a range between the count value of the counter 12 being sufficiently larger than 0 and that being sufficiently smaller than a count value corresponding to the width of the gate signal Z Then, the set value m is compared with the count value of the counter 12 at the comparator 17 to generate the control signal CNT for switching and supply it to the gate signal generator 14.

Figure 7:
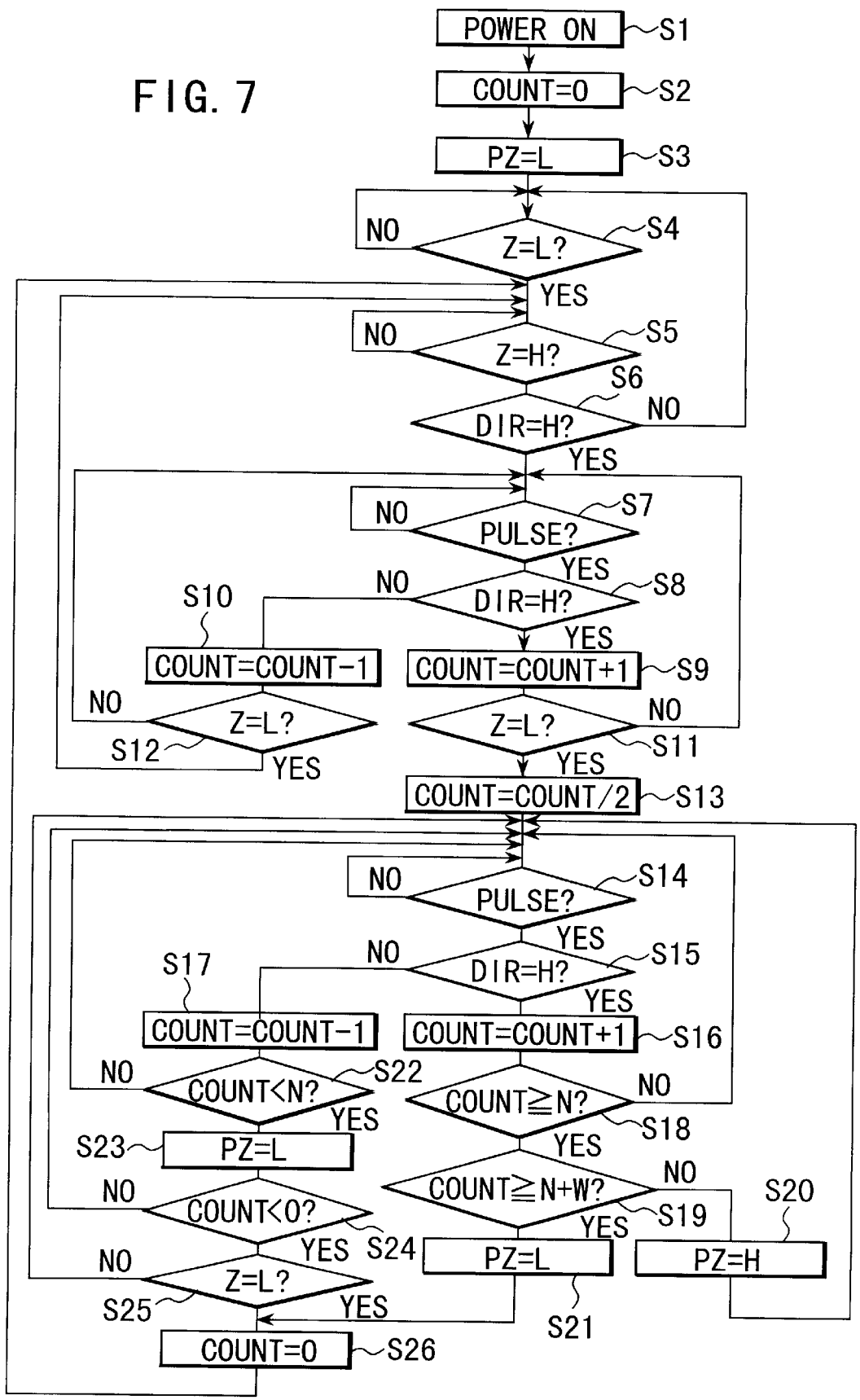
FIG. 7 is a flowchart showing a procedure to realize an origin detection process of the present invention with software.

The above embodiment enables to detect the origin with an extremely simple configuration and excellent reproducibility. According to the trials conducted by the inventors, the position variation width of the origin output by the conventional edge-detecting origin detection system is equal to 9.3 $\mu$m, where it is assumed that the gate signal width ZX=200 $\mu$m and relative variations of the primary origin signal ØZ and reference level VRef are 5%. To the contrary, the position variation width by the present system can be reduced to 0.5 $\mu$m and the reproducibility of the origin position is improved up to 18.6 times when the position pulse resolution is set at 0.1 $\mu$m FIG. 7 is a flowchart used for realizing an origin detection process of the present invention with software.

After putting power on (S1), resetting a count value COUNT and an origin output signal PZ (S2, S3) Next, monitoring the gate signal Z (S4). If the gate signal Z is H level (S5), confirming the moving direction DIR of the detection section 7 from the position pulse PULSE. If the moving direction DIR is negative, then returning to the step (S4) of monitoring the gate signal Z. If it is positive, then going to the next second stage (S6). At the second stage, monitoring the position pulse PULSE (S7), and in accordance with the moving direction (S8), counting the count value COUNT up (S9) or down (S10 This counting operation continues until the gate signal Z becomes L level (S11, S12). If it is detected that the gate signal Z has become L level (S11) during the detection section 7 moves in the positive direction, then dividing the count value COUNT by two (S13) and advancing to the next third stage.

At the third stage, monitoring the position pulse PULSE (S14), and in accordance with its direction (S15), counting the count value up (S16) or down (S17). At the time of up-count, if the count value COUNT reaches N or more (S18), until the count value COUNT reaches N+W (where W denotes a pulse width) (S19), setting an output origin signal PZ to H level (S20). If the count value COUNT reaches N+W or more, then setting the output origin signal PZ to L level (S21) and the count value COUNT to 0 (S26). At the time of down-count, if the count value COUNT lowers below N (S22), then setting the output origin signal PZ to L level (S23). If the count value COUNT lowers below 0 (S24) and the gate signal Z becomes L level (S25), then setting the count value COUNT to 0 (S26).

The above process enables to perform the origin detection with excellent reproducibility.

Whereas the position detection means that comprises the non-contact transparent photoelectric der is exemplified in the above embodiment, the position detection means for obtaining the primary origin signal ØZ and the position information is not particularly limited in this case. Rather, the output from a contact reflection photoelectric encoder can be used for obtaining a larger effect of the present invention. The patterns 8 and 9 for origin detection may also be simple slits or the random patterns as describe above.

According to the present invention, as described above, counting the position pulses during the gate signal obtained by binraizing the primary origin signal with the predetermined reference level remains active, and dividing the count value by two when the length of the gate signal is completely counted can provide a count value on the basis of the just medium point between the rise (or fall) and fall (rise) of the gate signal The medium point is hardly affected from the slow gradient of the edge of the primary origin signal. Thus, an effect is achieved that the origin can be detected with excellent reproducibility.

Having described the embodiments consistent with the present invention, other embodiments and variations consistent with the present invention will be apparent to those skilled in the art. Therefore, the invention should not be viewed as limited to the disclosed embodiments but rather should be viewed as limited only by the spirit and scope of the appended claims.

What is claimed is:

1. An origin detection apparatus for detecting an original position serving as a reference for measuring a relative position of an index scale to a main scale, comprising:

position detecting means for providing a position detection signal in accordance with a variation of the relative position of the index scale to the main scale, and providing a primary origin signal having a variable level in accordance with the degree of an overlap of origin detection patterns formed respectively on the main and index scales;

gate signal generating means for generating a gate signal which becomes active when the primary origin signal crosses above a predetermined reference level and which becomes inactive when the primary origin signal crosses below the predetermined reference level; and position pulse counting means for obtaining a count value, beginning to count position pulses derived from the position detection signal when the gate signal becomes active, and dividing a count value by two when the gate signal becomes inactive, wherein the count value obtained from the position pulse counting means after dividing by two at the position pulse counting means gives a reference for origin detection.

2. The origin detection apparatus of claim 1, further comprising an origin output means for feeding an output origin signal when a count value from the position pulse counting means after divided by two reaches a predetermined offset value.

3. The origin detection apparatus of claim 1 wherein the position detection signals comprise two-phase sinusoidal signals, further comprising an interpolation means for interpolating the two-phase sinusoidal signals to generate two-phase square wave signals, respectively.

4. The origin detection apparatus of claim 3 wherein the position pulse counting means counts up or down the position pulses based on a phase relationship between the two-phase square wave signals, the position pulses being generated from the two-phase square wave signals.

5. The origin detection apparatus of claim 1 wherein the gate signal generating means including:

a first comparator for detecting a fall transition of the primary origin signal with the predetermined reference level and detecting a rise transition of the primary origin signal with a higher level than the predetermined reference level;

a second comparator for detecting the fall transition of the primary origin signal with a lower level than the predetermined reference level and detecting the rise transition of the primary origin signal with the predetermined reference level; and a selection circuit for selecting the output from the first comparator during the first half of a duration after the gate signal becomes active and before the gate signal becomes non-active and selecting the output from the second comparator during the second half of the duration to feed the selected output as the gate signal.

6. The origin detection apparatus of claim 1, wherein the position pulse counting means comprises:

a first counter for counting the position pulses from the time when the gate signal becomes active;

a second counter for counting the position pulses from the time when the gate signal becomes active, for being preset a half of a count value of the first counter when the gate signal becomes inactive; and a comparator for comparing a count value of the second counter with a predetermined offset value to output an origin signal.

7. An origin detection method for detecting an original position serving as a reference for measuring a relative position of an index scale to a main scale, comprising the steps of:

providing a position detection signal in accordance with a variation of the relative position of the index scale to the main scale using a position detecting means;

providing a primary origin signal having a variable level in accordance with the degree of an overlap of origin detection patterns formed respectively on the main and index scales using a position detecting means;

generating a gate signal which becomes active when the primary origin signal crosses above a predetermined reference level and which becomes inactive when the primary origin signal crosses below the predetermined reference level using gate signal generating means;

obtaining a count value, using position pulse counting means, beginning to count position pulses derived form the position detection signal when the gate signal becomes active, and dividing a count value by two when the gate signal becomes inactive; and determining a reference for origin detection using the count value obtained from the position pulse counting means after dividing by two at the position pulse counting means.

* * * * *